United States Patent [19]

Davison et al.

[11] Patent Number: 4,620,148

[45] Date of Patent: Oct. 28, 1986

[54] CURRENT METER

[75] Inventors: Arthur L. Davison, Canyon Country; Martin D. Blackburn, Costa Mesa; Donald A. Sellek, Manhattan Beach, all of Calif.

[73] Assignee: Baird Corporation, Bedford, Mass.

[21] Appl. No.: 644,242

[22] Filed: Aug. 27, 1984

[51] Int. Cl.⁴ ............ G01R 17/06; G01R 19/26; H03K 13/02

[52] U.S. Cl. .................. 324/99 D; 324/111; 340/347 NT; 356/315

[58] Field of Search .......... 324/99 D, 111, 96; 340/347 NT; 356/315, 316, 317

[56] References Cited

U.S. PATENT DOCUMENTS

| | | | |
|---|---|---|---|
| 3,458,809 | 7/1969 | Dorey | 324/99 D |
| 3,713,023 | 1/1973 | Metcalf et al. | 324/99 D |
| 4,300,834 | 11/1981 | Demers et al. | 356/317 |
| 4,303,880 | 12/1981 | Hunt et al. | 324/99 D |
| 4,432,644 | 2/1984 | Demers et al. | 356/316 |

Primary Examiner—Ernest F. Karlsen

Attorney, Agent, or Firm—Morse, Altman & Dacey

[57] ABSTRACT

A precision current meter of wide dynamic range and sensitivity to low currents is disclosed. The precision current meter is particularly useful as a component for spectrochemical computations in spectrometers for the simultaneous multielement analysis of unknown samples in solution. The precision current meter comprises a source of input current, preferably a photomultiplier tube, an integrator having an integrating capacity for detecting the input current from the source, a source of reference currents including an offset current, a switch with a drain current coupled to the integrator. A clock is provided for generating clock signals for the current meter, including a series of pulses to actuate the switch and thereby to admit drain current segments to the integrator. A first counter is coupled to the output of the integrator to count the number of the series of actuating pulses during a predetermined time interval, and a second counter coupled to both the integrator output and the clock fixes the predetermined time interval. Preferably, both the integrator output and the switch are coupled via optical couplers to the counters.

10 Claims, 6 Drawing Figures

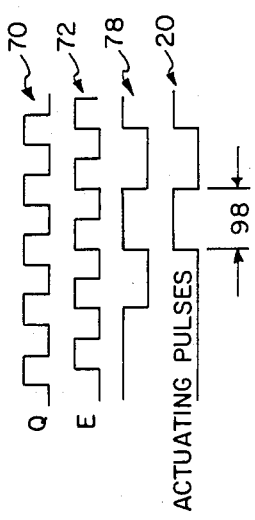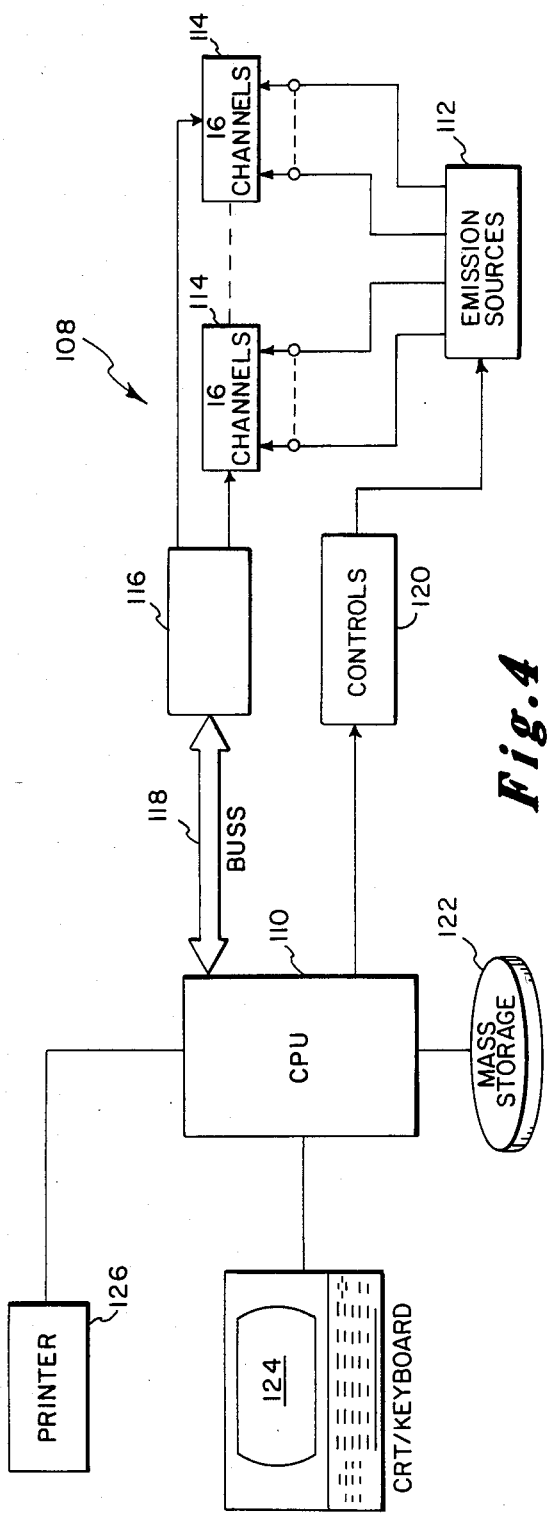

CURRENT METER

BACKGROUND OF THE INVENTION

1. Field of the Invention

The present invention relates generally to current meters and, more particularly, to a precision current meter particularly useful for spectrochemical computations in spectrometers.

2. The Prior Art

Current meters have been widely used and over a long period of time. There are many kinds and types of current meters, ranging from a simple ammeter to a rather complex one. The more complex the ammeter, the more versatile it gets. There are always some tradeoffs among desirable performance characteristics. Usually, current meters are designed for measuring either very low level signals or very high level signals but not both with acceptable performance at both ends of the signal levels. There is thus plenty of room for improvements. This is particularly so when the current meter is designed or required for specialized applications, such as for effecting spectrochemical computations in spectrometers. For, such applications usually require a system which is both extremely sensitive to low current signals and also possesses a wide dynamic range, preferably of seven or eight orders of magnitude.

SUMMARY OF THE INVENTION

It is a principal object of the present invention to overcome the above disadvantages by providing a precision current meter of wide dynamic range and of sensitivity to both low current signals as well as to high current signals.

More specifically, it is an object of the present invention to provide a precision current meter particularly well suited as a component for spectrochemical computations in spectrometers used for the simultaneous multielement analysis of unknown samples, usually minute trace elements measured in parts per billion (ppb). The precision current meter essentially comprises a source of input current signals coupled to a summing junction, an integrator having an integrating capacitor and coupled to the summing junction for detecting the input current signals from the source, a source of reference currents coupled to the summing junction and including an offset current, a switch and a drain current, a clock for generating clock signals, including a series of pulses to actuate the switch and thereby to admit drain current segments to the integrator, a first counter coupled to the output of the integrator to count the number of the series of actuating pulses during a predetermined time interval, and a second counter coupled to both the integrator output and the clock to fix the predetermined time interval. Preferably, the source of input current signals is a photomultiplier tube. Preferably, the precision current meter is capable of handling input current signals over a dynamic range from about $10^{-13}$ amperes to about $10^{-5}$ amperes. Preferably, both the integrator output and the switch are coupled via optical couplers to the counters so as to electrically isolate the latter from the former, further improving the performance of the current meter. Preferably, the spectrometer is an inductively coupled plasma spectrometer having a central processing unit and the current meter is provided with a digital interface to the central processing unit. Preferably, the intergrating capacitor is formed of polystyrene or teflon and the summing junction is shielded to prevent leakage currents from reaching the integrator.

Other objects of the present invention will in part be obvious and will in part appear hereinafter.

The invention accordingly comprises the current meter of the present disclosure, its components, parts and their interrelationships, the scope of which will be indicated in the appended claims.

BRIEF DESCRIPTION OF THE DRAWINGS

For a fuller understanding of the nature and objects of the present invention, reference is to be made to the following detailed description which is to be taken in connection with the accompanying drawings, wherein:

FIG. 3 shows the relationship between pulses helpful in understanding the invention;

FIG. 4 is a block diagram of the current meter and certain parts of a spectrometer;

DETAILED DESCRIPTION OF THE PREFERRED EMBODIMENTS

Figure 1:
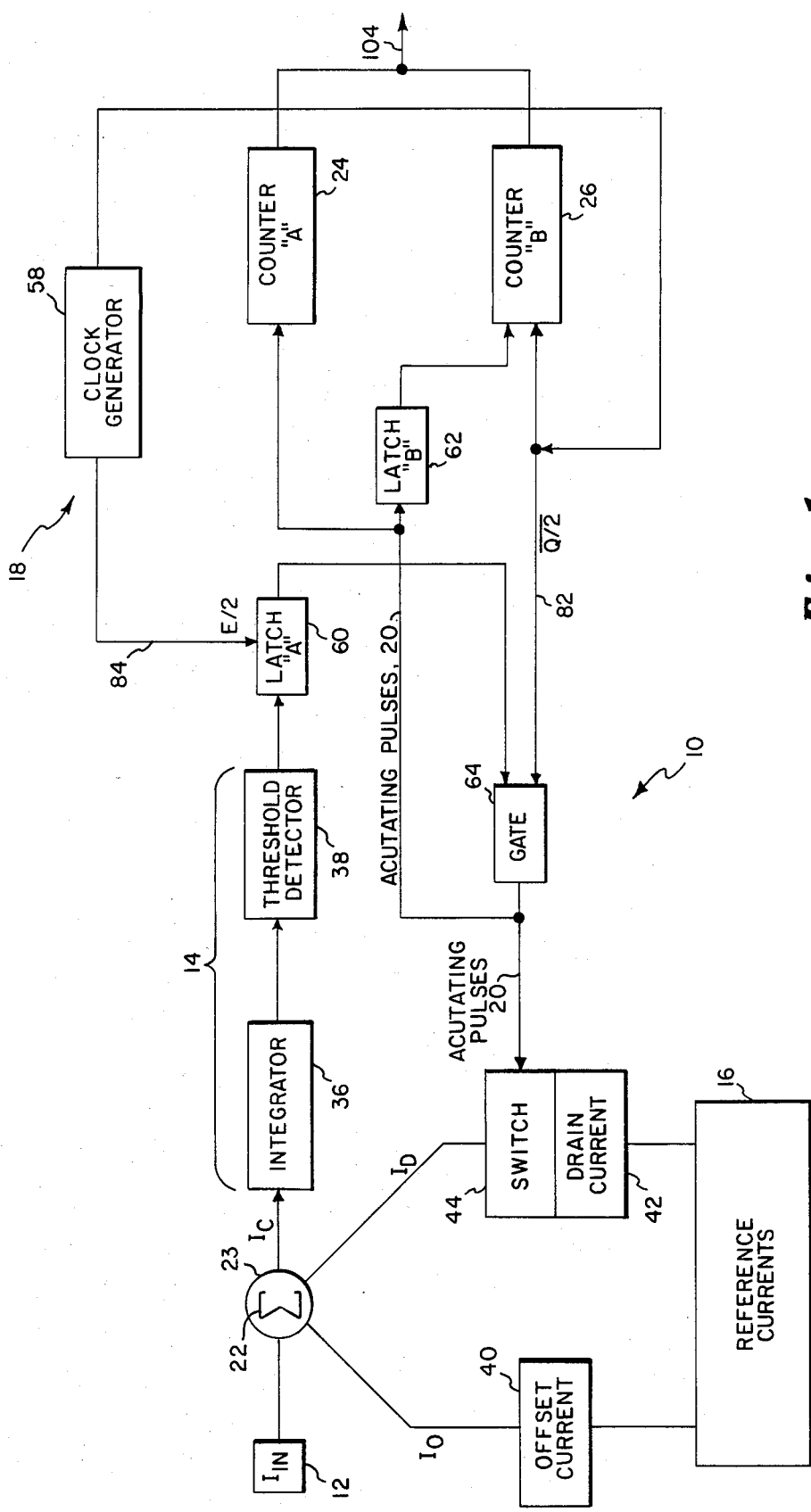
FIG. 1 is a block diagram of a current meter constructed in accordance with the present invention.

Generally, the illustrated embodiment of a precision current meter 10 of wide dynamic range and sensitivity to low currents comprises a source 12 of input current, means 14 for detecting the input current, a source 16 of reference currents, means 18 for generating a series of pulses 20 to actuate a part of the reference currents source 16, a summing junction 22 and a counter 24 coupled to the generating means 18 to count the series of pulses 20 applied to actuate the part of the reference currents source 16 during a predetermined time interval. A second counter 26 is provided to fix this predetermined time interval.

Figure 5:
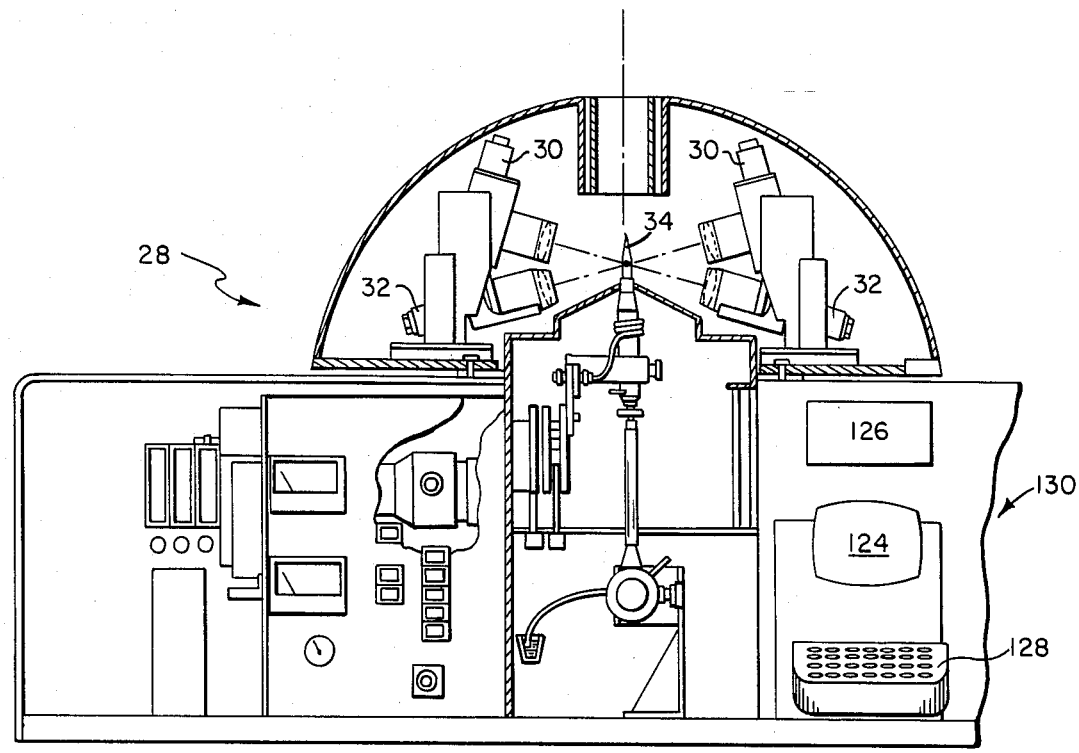
FIG. 5 is a front elevational section, with parts broken away, of an inductively coupled plasma spectrometer incorporating the current meter of the invention.

The precision current meter 10 can be used as an absolute current meter per se. Current meter 10 is, however, particularly useful as a component part for spectrochemical computations in spectrometers for the simultaneous multielement analysis (SMA) of many trace elements. A front elevational section, with parts broken away, of one preferred inductively coupled plasma (ICP) spectrometer 28, incorporating the current meter 10 of the invention, is shown in FIG. 5. The current meter 10 of the invention is equally applicable to spectrometers of the arc and spark types. Further, the ICP spectrometer can be of the atomic emission kind or of the atomic fluorescence kind as more fully disclosed and described in U.S. Pat. Nos. 4,300,834 and 4,432,644, both assigned to the Baird Corporation, Bedford, Mass., the disclosures of which are incorporated herein by reference.

The dynamic range possessed by the precision current meter 10 is about eight orders of magnitude from about $10^{-13}$ amperes to about $10^{-5}$ amperes. Further, the precision current meter 10 is extremely sensitive to low currents of about $10^{-13}$ amperes, further enhancing the detection levels of spectrometers employing them. It is thus particularly well suited for the detection of minute trace elements producing at best weak signals. Spectrometers also encounter problems of spectral line overlap interferences and of noise, the latter being particularly troublesome for good signal to noise ratio. The current meter 10 of the invention is particularly useful in substantially reducing if not eliminating such noise by employing what in effect amounts to dual isolation of the input signal from the processing electronics.

Figure 6:
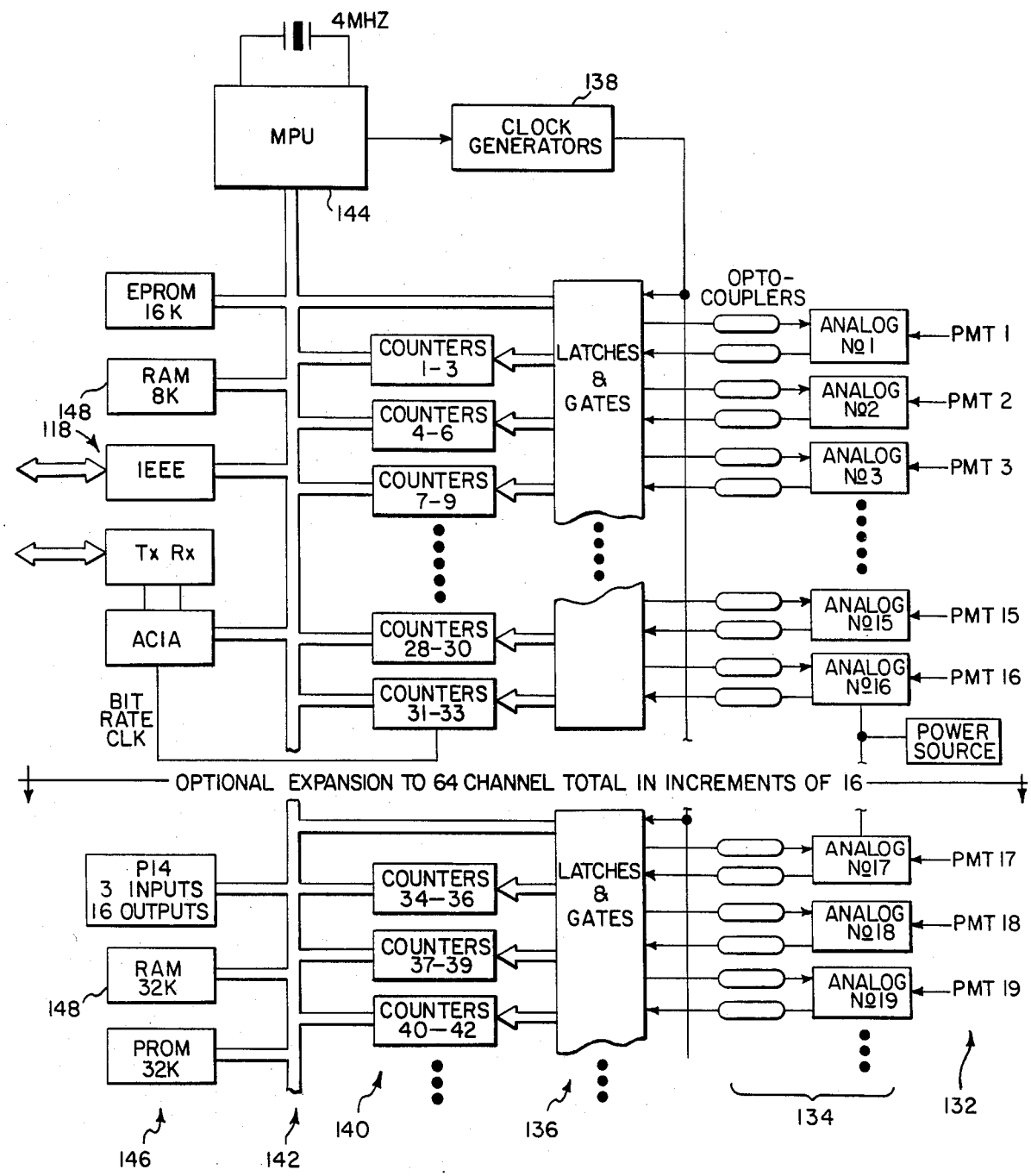
FIG. 6 is a block diagram of a multichannel sub-system for use in the spectrometer of FIG. 5.

Preferably, the source 12 of input current signals coupled to the summing junction 22 is a photomultiplier tube 30(PMT), such as the one depicted in FIG. 5 and used in conjunction with a hollow cathode lamp 32 (HCL), both viewing a segment of a plasma stream 34. As known, the plasma stream 34 is used to atomize a sample solution containing a plurality of unknown trace elements, which the spectrometer 28 is employed to measure. It is to be understood that the spectrometer 28 contains a plurality of pairs of PMT's and HCL's, with each pair being a channel designed to detect one particular trace element. These several channels are illustrated in FIG. 6.

The means 14 for detecting the input signals coupled to the summing junction 22 includes an integrator 36 and a threshold detector 38, observe FIG. 1. And the source 16 of reference currents also coupled to the summing junction 22 includes an offset current 40 and a drain current 42, and a switch 44 designed to couple drain current segments to the summing junction 22 when actuated by the actuating pulses 20. The current ($I_C$) going into the integrator 36 equals the input current 12 ($I_N$) plus the offset current 40($I_O$) minus the drain current 42 ($I_D$), the effect being a maintenance of zero average current at the integrator input. Initially, the drain current 42($I_D$) equals zero. The offset current 40($I_O$) is chosen relatively large with respect to the input current 12($I_N$), in fact many orders of magnitude greater than the input current. The large offset current ($I_O$) assures that the integration will never be completely locked up. It also permits the utilization of low cost devices with relatively poor specifications in the integrator 36 than would be the case otherwise.

Figure 2:
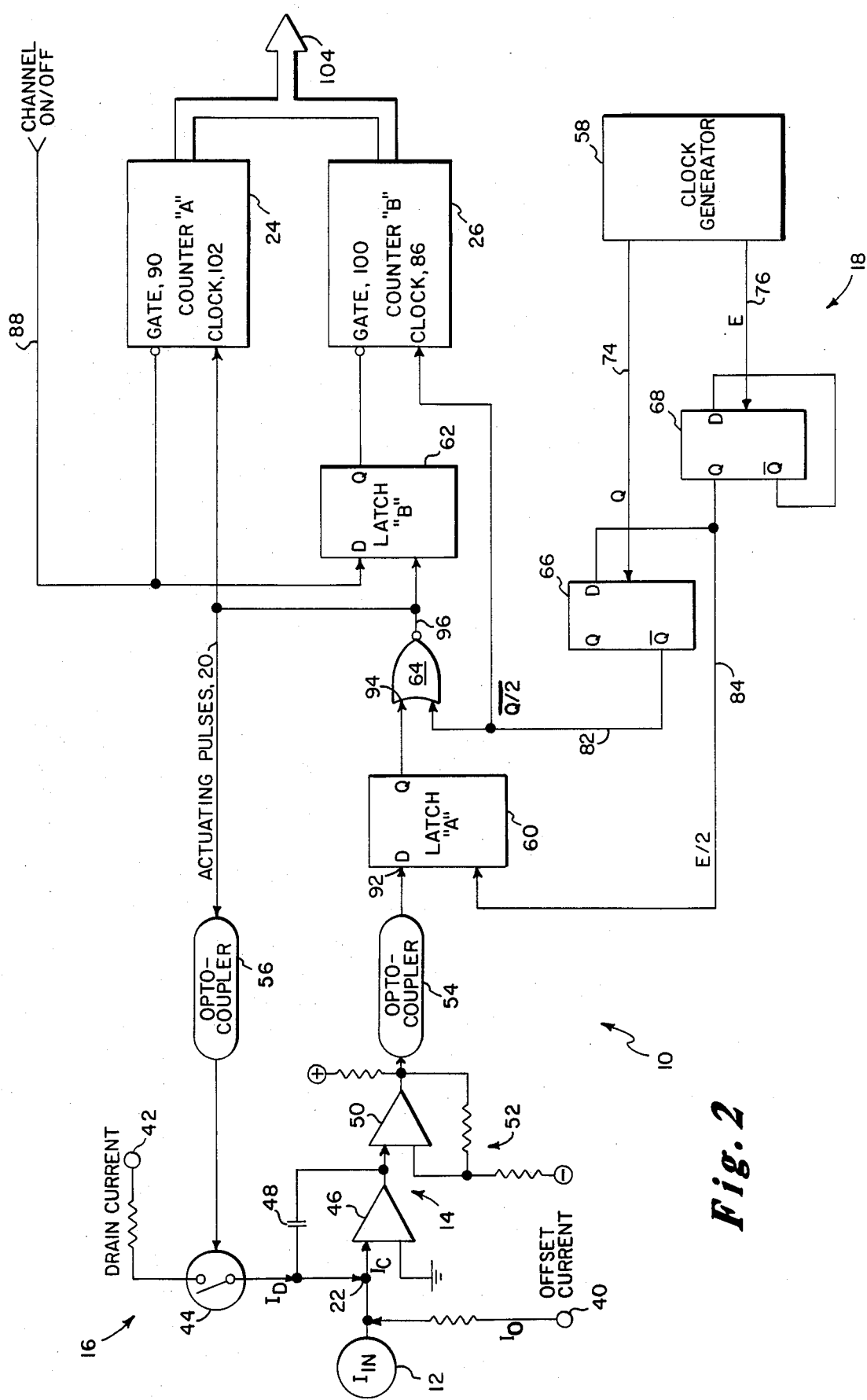
FIG. 2 is a schematic and block diagram of the current meter of FIG. 1.

The integrator 36 includes an inverting amplifier 46 and an integrating capacitor 48 in its feedback loop, observe FIG. 2. A negative input current 12($I_N$) at the input of the inverting amplifier 46 produces an output voltage represented by a positive voltage ramp whose shape is proportional to the input current 12($I_N$). The output of the inverting amplifier 46 is coupled to the threshold detector 38, which preferably is a comparator amplifier 50. A voltage divider network 52 sets the desired predetermined threshold level for the comparator amplifier 50. As is evident from a viewing of FIG. 2, both the output of the comparator amplifier 50 and the input to the switch 44 are coupled to the remaining circuitry, including the counters 24 and 26, by respective optical couplers 54 and 56. The optical couplers 54 and 56 preferably include light pipes having transducers at their respective ends and serve electrically to isolate the circuitry above described from the remaining circuitry, in particular from the counters 24 and 26. For reasons of clarity, the couplers 54 and 56 are not shown in FIG. 1.

The means 18 for generating a series of pulses includes a clock generator 58, latches "A" and "B," 60 and 62 respectively, a gate 64 and a pair of devices 66 and 68 coupled to the clock generator 58. The clock generator 58 generates pulses "Q" and "E," 70 and 72 respectively in FIG. 3, and transmits these pulses via leads 74 and 76 to the devices 66 and 68. The devices 66 and 68 essentially divide these signals "Q" and "E," producing pulses Q/2 and E/2, 78 on leads 82 and 84 respectively. The pulses Q/2 are coupled both to one input of the gate 64 and to an internal clock 86 in the counter "B" 26. The pulses E/2, on the other hand, are coupled to one input of the latch "A" 60.

The current meter 10, as above described and representing a single channel, operates as follows. The current meter 10 has two modes of operation: a stand-by mode and an integrate mode. In the "stand-by mode," no signal is coupled via a lead 88 to an internal gate 90 of the counter "A" 24 and to one input of latch "B" 62. Thus, the counters "A" and "B" 24 and 26 remain inoperative during the stand-by mode. The clock generator 58, via the devices 66 and 68, in turn, delivers the timing signals E/2 and Q/2 to the latch "A" 60 and the internal clock 86 of the counter "B" 26. With the source 16 of reference currents supplying a steady flow of large offset current ($I_O$) 40 to the summing junction 22, and there being no input current ($I_N$) from the source 12, the current ($I_C$) being admitted into the inverting amplifier 46 and charging the integrating capacitor 48 equals to the offset current ($I_O$) 40 minus the number of drain current pulses ($I_D$) 42 of fixed length (or coulombs) reaching the summing junction 22 due to the periodic closing of the switch 44. This, of course, has the consequence of continuously "nulling" the current meter 10, keeping it "alive" and in the linear region best suited to PMT operation.

This nulling integration is continuing as follows. With the comparator 50 noting an output voltage in excess of its set threshold level from the output of the inverting amplifier 46 due to the offset current ($I_O$) 40, the comparator 50 generates an output signal which is coupled, via the optical coupler 54, to a second input 92 of the latch "A" 60. It will be recalled that pulses E/2 already are continuously coupled to the other input of the latch "A" 60 via the lead 84. These two inputs now combine to actuate the latch "A" 60 so as to pass a signal to a second input 94 of the gate 64, at whose other input the pulses Q/2 already are present. Consequently, the gate 64 now is opened so as to generate a series of actuating pulses 20 on lead 96. Each of these series of actuating pulses 20 is of fixed duration 98, preferably one microsecond, and is coupled via the optical coupler 56 to the switch 44, actuating the same for that fixed duration 98. Each time the switch 44 is actuated, it couples one segment of a series of segments of drain current pulses 42 to the summing junction 22. Each of these segments is of fixed length and preferably is measured in coulombs. (As known, "one coulomb" represents a unit of electric charge that crosses a surface in one second when a steady current of one ampere is flowing across that surface.) These segments of fixed amount of current pulses ($I_D$) 42 admitted to the summing junction Z2 persist until they are equal to but opposite in polarity to the offset current ($I_O$) 40 constantly reaching the summing Junction. Thus, the input current ($I_C$) to the inverting amplifier 46 is continuously being nulled.

In the "integrate mode," the current meter 10 first is turned on, at the detection of a first input current pulse 12, by a signal coupled via the lead 88 directly to the counter "A" 24 and via the latch "B" 62 to an internal gate 100 of the counter "B" 26. With both counters "A" and "B" thereby actuated, counter "A" 24 now begins to count the same actuating pulses 20 that actuate the switch 44 which also are coupled to an internal clock 102 in the counter "A" 24. This count in counter "A" 24 is proportional to the average input current signal 12 level during the integrate time interval. The integrate time interval, in turn, is determined by counter "B" 26, which is actuated by the first actuating pulse 20 via the latch "B" 62 and continues counting through the last plus one actuating pulses 20. Thus, the total counts accumulated in counter "B" 26 are directly proportional to time. The ratio of the counts in counter "A" over that in counter "B" times the clock rate, as determined by the timing signal pulses 78, and appearing at the output 104 of the current meter 10 provides an accurate rate per second for the integrate time interval. The rate preferably is measured in couloumbs per second. Rate resolution is a function of the clock rate and the offset current. The rate thus is proportional to the average input current signal 12 level detected by the integrator 14 over the integrate time interval and is expressed digitally. As such it can be stored or processed in a central processing unit (CPU).

The design of the current meter 10 is such that it uses the same capacitor 48 both for input current signal 12 integrating and for current balancing by $I_D$ 42 and $I_O$ 40. Thus, it places negligible demands on its stability and accuracy. Nevertheless, it is preferred that the capacitor 48 be formed of polystyrene or teflon, and that the summing junction 22 be shielded as at 23 to guard against leakage currents which could otherwise adversely affect the operation of the current meter 10.

FIG. 4 shows the interaction of a multi-channel current meter 108 with a spectrometer having a CPU 110 and a plurality of emission sources 112, each being represented by a like plurality of PMT's, i.e., one for each channel. It is to be understood that each one of the channels of the current meter 108 is identical with the current meter 10 as above described with refence to FIGS. 1-3. Preferably, the channels are in increments of sixteen 114 each, with a preferred maximum practicable expansion to sixty-four channels. Each of these increments of sixteen channels 114 includes the analog component elements of each of the sixteen current meters 10 between their respective summing junctions 22 through the optical couplers 54 and 56. The digital component elements of the plurality of current meters 10 comprising all the respective channel increments 114 preferably are centralized in a central assembly 116. These digital component elements include the counters "A" and "B" 24 and 26, the clock generator 58, devices 66 and 68, latches "A" and "B" 60 and 62, and the gate 64. The central assembly 116 is, in turn, interfaced with the CPU 110 via a standard digital interface 118 for programmable instrumentation, such as an IEEE 488 Byte Serial Buss.

As known, and as more fully described in the above-mentioned U.S patents, the CPU 110 also controls via appropriate control signals 120 such functions, amongst others, of the spectrometer 28 as sampling, diluting, aspirating, atomizing, etc. The signals processed by the CPU 110 are then stored in a storage 122 and/or presented on a display 124 and/or printed on a suitable printer 126, comprising, together with an appropriate keyboard 128, a readout system 130.

In FIG. 6 is shown a block diagram of a multi-channel sub-system for use in the spectrometer 28 depicted in FIG. 5. The sub-system discloses a plurality of PMT's 132, with each being representative of one measuring channel, a plurality of analog elements 134, each including the means 14 of detecting the input current signals from the PMT's 132, the source 16 of reference currents and the optical couplers 54 and 56, a plurality of latches and gates 136 coupled to the analog elements 134 and to clock generators 138, a plurality of counters 140 coupled to the latches and gates 136, and circuitry 142 coupling the counters 140 both to a microprocessing unit 144 (also driving the clock generators 138) and to other appropriate devices 146, including the digital interface 118.

As mentioned, the use of the optical couplers 54 and 56 provides one line of isolation of the analog elements of the current meter 10 from the digital electronics thereof, including in particular the counters "A" and "B" 24 and 26. There is a second line of such isolation which is inherent in the design of the current meter 10 itself. And that is that the current meter 10 does not measure the level of the input current signals ($I_N$) directly. Rather, it measures it indirectly by counting the number of actuating pulses 20 it takes to null the current ($I_C$) seen by the integrator 36 despite the presence of the $I_N$ from the source 12.

As known, a very hostile electromagnetic environment is created by any spectrometer during its atomization period. The recognition of that environment has led to the design and the development of the current meter 10. For, it is during these atomization periods that the current meter 10 does its function. When the current meter 10 is used as the multi-channel current meter 108 in the computer 28, its CPU 110 pre-programs the multi-channel current meter 108 via the buss 118 prior to each atomization period. The CPU 110 then issues a "start" command signal to the meter 108 and terminates communication with the meter 108 after the atomization is completed. The meter 108 uses its own time base, as determined by the clock generators 138, to sequence through the pre-programmed events, storing the acquired data in one of its own random access memories 148. After the raw data is acquired, the meter 108 reduces the data to its final form in the devices 146 (FIG. 6) and then waits for the CPU 110 to extract the data via the buss 118 and for the signal to set up the meter 108 for the next atomization period. The current meter of the invention preferably is designed to operate in a temperature range between about zero degree Centigrade to about fifty degrees Centigrade. The current meter 10 also is unipolar and serves as an instrument controller for each of the channels. An a.c. power source 150 is provided, with the predetermined integrating time interval being so chosen as to be a multiple of the time period of the source 150. This renders the current meter 10 insensitive to the effects of the harmonics that may exist on the input current signals 12.

Thus it has been shown and described a precision current meter 10, which is particularly useful as a component for spectrochemical computations in spectrometers, which meter 10 satisfies the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A current meter possessing a dynamic range of about eight orders of magnitude and having an input and an output, said current meter comprising:
   (a) a source of input current coupled to said input;

(b) means also coupled to said input for detecting said input current from said source;

(c) a source of reference currents coupled to said input and said detecting means;

(d) means for generating a series of pulses to actuate said reference currents source;

(e) a counter coupled to said generating means to count said series of pulses applied to actuate said reference currents source during a predetermined time interval;

(f) said means for generating said series of pulses including a clock generator to generate clock pulses, a latch and a gate coupled between said detecting means and said counter and enabled by said detecting means; and (g) a first optical coupler connected between said latch and said detecting means and a second optical coupler connected between said gate and said source of reference currents.

2. The current meter of claim 1 wherein said source of reference currents includes an offset current and a drain current, and a switch selectively to couple said drain current to said detecting means.

3. The current meter of claim 1 further including a second counter and a second latch coupled between said gate and said clock generator, and means for actuating said second counter via said second latch.

4. The current meter of claim 1 wherein said detecting means includes an integerator including an inverting amplifier and a capacitor in its feedback loop, said capacitor being charged both by said source of input current and by said series of pulses, said capacitor formed of one of a group of materials consisting of polystyrene and teflon.

5. A precision current meter of wide dynamic range for detecting low current signals of about $10^{-13}$ amps and reducing the detected signals to digital form suitable for storage and/or analysis comprising:

(a) a source of input current signals connected to a summing junction;

(b) means for detecting said input current signals connected to said summing junction, said means including an integrator having an integrating capacitor and a threshold detector;

(c) a source of reference currents connected to said summing junction and inlcuding an offset current, a drain current, and a switch;

(d) means for generating a series of pulses to actuate said switch selectively to couple said drain current to said summing junction;

(e) a counter connected to said generating means to count said series of pulses during a predetermined time;

(f) a clock generator for generating a pair of timing signals, respectively coupled to said counter and said generating means;

(g) a latch and a gate connected between said detecting means and said counter; and optical coupling means connected between said detecting means and said counter to isolate the analog from the digital elements in said precision current meter.

6. The precision current meter of claim 5 wherein said source is a photomultiplier tube and said summing junction is shielded, and which further includes a second counter and a second latch connected between said gate and said clock geneator, and means for actuating said first and second counters.

7. A current meter for use in a spectrometer of the type including a source of input current signals representative of measurements of sample intensities, the current meter comprising:

(a) a summing junction coupled to said source of input current signals;

(b) means for detecting said input current signals coupled to said summing junction;

(c) a source of reference currents coupled to said summing junction and including a constantly flowing offset current, a switch and a drain current, said switch selectively to couple said drain current to said summing junction;

(d) means including a clock for generating a series of pulses to close said switch for the duration of said pulses;

(e) a first counter coupled to said generating means to count said series of pulses during a predetermined time interval;

(f) a second counter coupled to said generating means to fix said predetermined time interval;

(g) means for actuating said first and second counters; and (h) optical couplers connected between said detecting means and said first and second counters.

8. The current meter of claim 7 further including a digital interface to a central processing unit within said spectrometer, a first latch and a gate coupled between said detecting means and said first counter, a second latch coupled between said gate and said second counter, and having a spectrometer or a type having a plurality of sources of input current signals, each representative of measurements of different samples and their intensities, with each of said plurality of sources defining separate individual channels.

9. The current meter of claim 8 which is unipolar and serves as an instrument controller for each of said channels, and having and a.c. power source and wherein said predetermined time interval is a multiple of the time period of said power source.

10. The current meter of claim 7 wherein said spectrometer is an inductively coupled plasma atomic spectrometer.

* * * * *